US008625382B2

(12) United States Patent
Hendrickson

(10) Patent No.: US 8,625,382 B2
(45) Date of Patent: Jan. 7, 2014

(54) BLOCK-ROW DECODERS, MEMORY BLOCK-ROW DECODERS, MEMORIES, METHODS FOR DESELECTING A DECODER OF A MEMORY AND METHODS OF SELECTING A BLOCK OF MEMORY

(75) Inventor: Nicholas Hendrickson, Ranch Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 255 days.

(21) Appl. No.: 13/168,699

(22) Filed: Jun. 24, 2011

(65) Prior Publication Data

US 2012/0327735 A1 Dec. 27, 2012

(51) Int. Cl.
*G11C 8/00* (2006.01)
(52) U.S. Cl.
USPC ............... 365/230.06; 365/226; 365/230.03; 365/230.01
(58) Field of Classification Search
USPC .................. 365/230.06, 226, 230.03, 230.01
See application file for complete search history.

(56) References Cited

U.S. PATENT DOCUMENTS

| 7,023,750 | B2 | 4/2006 | Aakjer |
| 7,177,201 | B1 | 2/2007 | Takayanagi |
| 7,675,317 | B2 | 3/2010 | Perisetty |
| 2008/0159053 | A1* | 7/2008 | Yan et al. ................. 365/230.06 |
| 2009/0080256 | A1* | 3/2009 | Lee et al. ................. 365/185.11 |
| 2009/0273984 | A1 | 11/2009 | Tanzawa |
| 2011/0090739 | A1 | 4/2011 | Goda et al. |
| 2012/0195142 | A1* | 8/2012 | Lee et al. ...................... 365/194 |

* cited by examiner

*Primary Examiner* — Vu Le
*Assistant Examiner* — Han Yang
(74) *Attorney, Agent, or Firm* — Dorsey & Whitney LLP

(57) ABSTRACT

Block-row decoders, memory block-row decoders, memories, methods for deselecting a decoder of a memory and methods of selecting a block of memory are disclosed. An example memory block-row decoder includes a plurality of block-row decoders, each of the block-row decoders having a decoder switch tree. Each block-row decoder is configured to bias a block select switch of the decoder switch tree with a first voltage while the block-row decoder is deselected and further configured to bias decoders switches of the decoder switch tree that are coupled to the block select switch with a second voltage while the block-row decoder is deselected, the second voltage less than the first voltage. An example method of deselecting a decoder of a memory includes providing decoder signals having different voltages to decoder switches from at least two different levels of a decoder switch tree while the decoder is deselected.

19 Claims, 4 Drawing Sheets

US 8,625,382 B2

BLOCK-ROW DECODERS, MEMORY BLOCK-ROW DECODERS, MEMORIES, METHODS FOR DESELECTING A DECODER OF A MEMORY AND METHODS OF SELECTING A BLOCK OF MEMORY

TECHNICAL FIELD

Embodiments of the present invention relate generally to semiconductor memories, and more specifically in one or more of the illustrated embodiments, to biasing block-row decoders for deselected memory blocks of a memory.

BACKGROUND OF THE INVENTION

Data in electronic circuits may be stored in memory, for example, semiconductor memory. Examples of semiconductor memory include volatile memory, which is limited to storing data while power is provided to the memory, and non-volatile memory, which can store data even when power is no longer provided to the memory. Non-volatile memories have become more popular as mobile and compact electronic devices, for example, mobile phones, digital cameras, portable computers, and other such devices, require storage of information even after the electronic device is switched off.

Memory typically includes an array of memory cells which are used to store data. The memory cells are arranged in the array in a manner which can be addressed using memory addresses. The memory addresses are provided to the memory and decoded by address decoders to select a memory location or locations corresponding to a memory address. In operating the address decoders, the memory locations corresponding to the memory address are selected while the remaining memory locations remain deselected in order to preserve the data stored by the deselected memory locations.

In decoding memory addresses, circuitry included in the address decoders are operated by biasing the various circuitry, for example, decoders switches, to different voltages. For example, voltages are provided to close decoder switches coupled to memory locations to be accessed while decoder switches coupled to deselected memory locations are biased to remain open. The voltages applied to the decoder circuitry over time may degrade their performance, and in extreme cases, cause the circuitry to fail such as due to voltage induced stresses. In these cases where the decoder circuitry fails, the memory may become non-functional.

Therefore, it is desirable to have alternative designs for decoder circuitry and alternative methods for operating decoder circuitry.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
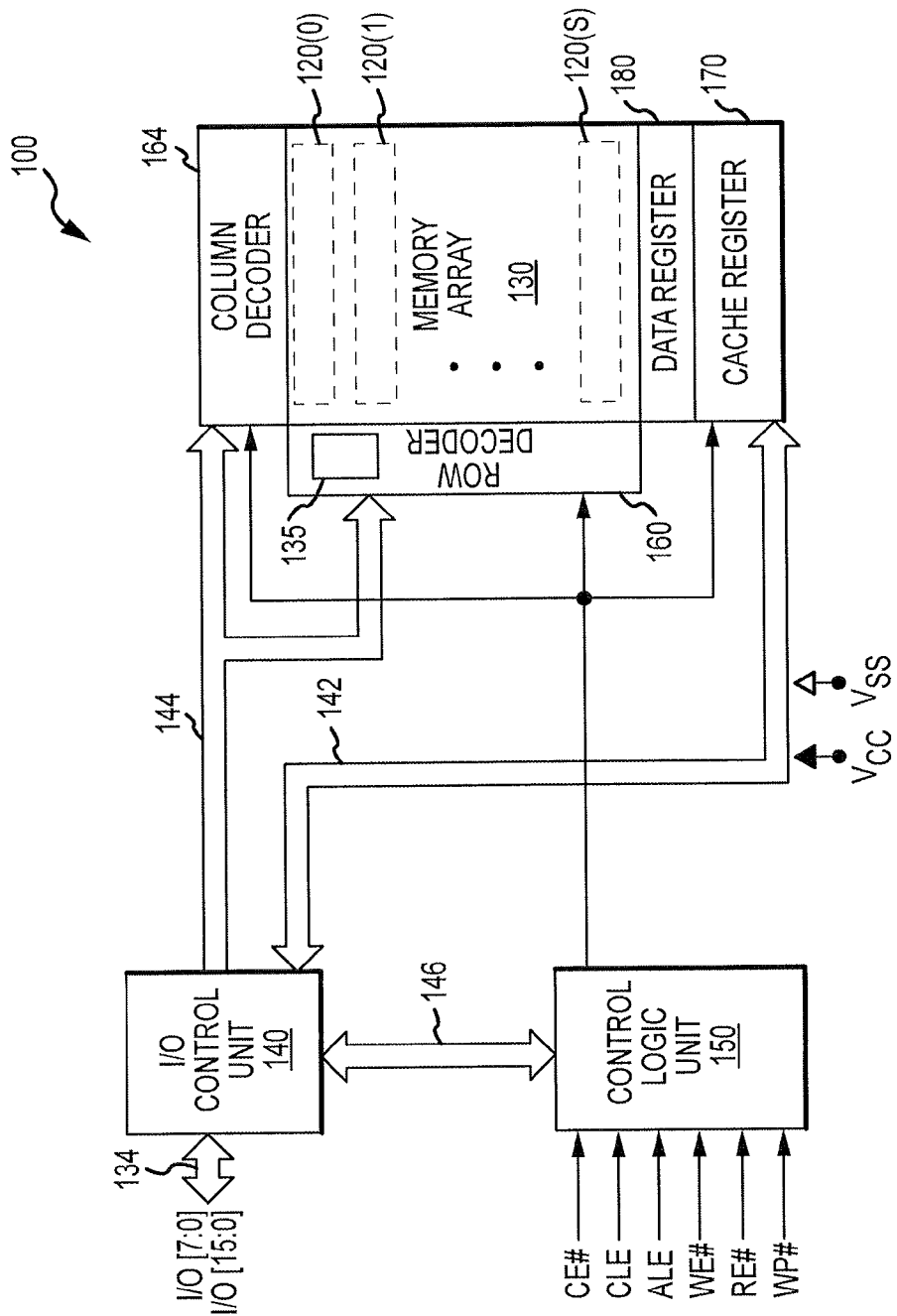
FIG. 1 is a simplified block drawing of a memory including a block-row decoder according to an embodiment of the invention.

FIG. 1 illustrates a memory 100 including a block-row decoder according to an embodiment of the invention. The memory 100 includes an array 130 of memory cells which may be arranged in blocks of memory 120(0)-120(S). Command signals, address signals and write data signals may be provided to the memory 100 as sets of sequential input/output ("I/O") signals transmitted through an I/O bus 134. Similarly, read data signals may be provided from the memory 100 through the I/O bus 134. The I/O bus is connected to an I/O control unit 140 that routes the signals between the I/O bus 134 and an internal data bus 142, an internal address bus 144, and an internal command bus 146. The memory 100 also includes a control logic unit 150 that receives a number of control signals either externally or through the command bus 146 to control the operation of the memory 100.

The address bus 144 provides block-row address signals to a memory block-row decoder 160 and column address signals to a column decoder 164. The memory block-row decoder 160 and column decoder 164 may be used to select memory cells for memory operations. The memory block-row decoder 160 includes block-row decoders 135 according to embodiments of the invention. Each of the block-row decoders 135 is associated with a respective one of the blocks of memory 120 and is configured to decode memory addresses for selecting a row of memory cells on which memory operations are performed, for example, erase, program, and read operations. The column decoder 164 enables write data signals to be applied to columns of memory corresponding to the column address signals and allow read data signals to be coupled from columns corresponding to the column address signals.

In response to the memory commands decoded by the control logic unit 150, the memory cells in the array 130 are erased, programmed, or read. After the block-row address signals have been provided on the address bus 144, the I/O control unit 140 routes write data signals to a cache register 170. The write data signals are stored in the cache register 170 in successive sets each having a size corresponding to the width of the I/O bus 134. The cache register 170 sequentially stores the sets of write data signals for an entire page (e.g. a row or part of a row of memory cells) of memory cells in the array 130. All of the stored write data signals are then used to program a of memory cells in the array 130 selected, at least in part, by the block-row address coupled through the address bus 144. In a similar manner, during a read operation, data signals from a row or block of memory cells selected, at least in part, by the block-row address provided on the address bus 144 are stored in a data register 180. Sets of data signals corresponding in size to the width of the I/O bus 134 are then sequentially transferred through the I/O control unit 140 from the data register 180 to the I/O bus 134.

Figure 2:
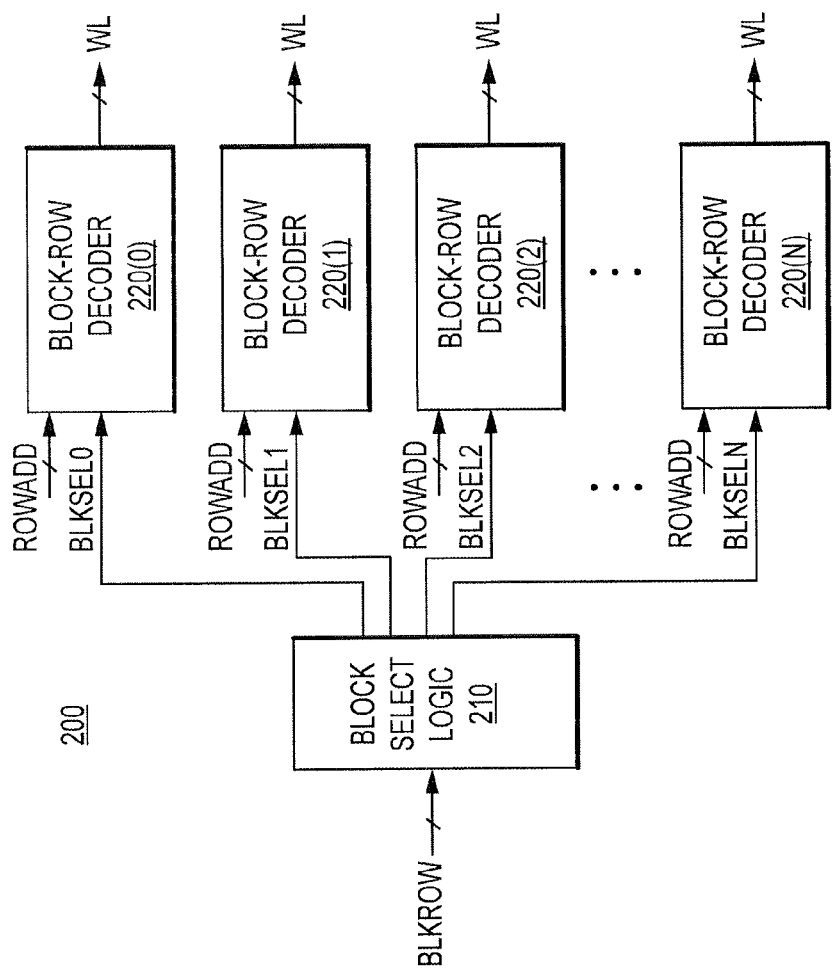
FIG. 2 is a simplified block drawing of a memory block-row decoder including block-row decoders according to an embodiment of the invention.

FIG. 2 illustrates a portion of a memory block row-decoder 200 according to an embodiment of the invention. The portion of the memory block-row decoder 200 may be included in the memory block-row decoder 160 of FIG. 1. Memory block select logic 210 included in the memory block-row decoder 200 is configured to receive block and row addresses BLK-ROW and select a block-row decoder 220(0)-220(N) based on the BLKROW addresses. The block select logic 210 provides an active block selection signal BLKSEL to select a block-row decoder 220 and provides inactive BLKSEL signals to maintain deselection of the other block-row decoders 220. The block-row decoders 220 are coupled to respective blocks of memory, for example, to memory cells of a respective block of memory through word lines WLs. The block-row decoders 220 are configured to provide signals to a respective block of memory to perform a requested memory operation for the memory corresponding to row memory addresses ROWADD when selected. In operation, the block select logic 210 decodes the BLKROW addresses to provide an active BLKSEL signal to select a memory block-row decoder 220 for a memory operation, for example, read, program, or erase operations. Other memory block-row decoders 220 remain deselected by an inactive BLKSEL signal provided by the block select logic 210. As will be described in more detail below, the deselected memory block-row decoders 220 are biased to prevent inadvertent memory access to the respective blocks of memory to which they are coupled.

Figure 3:
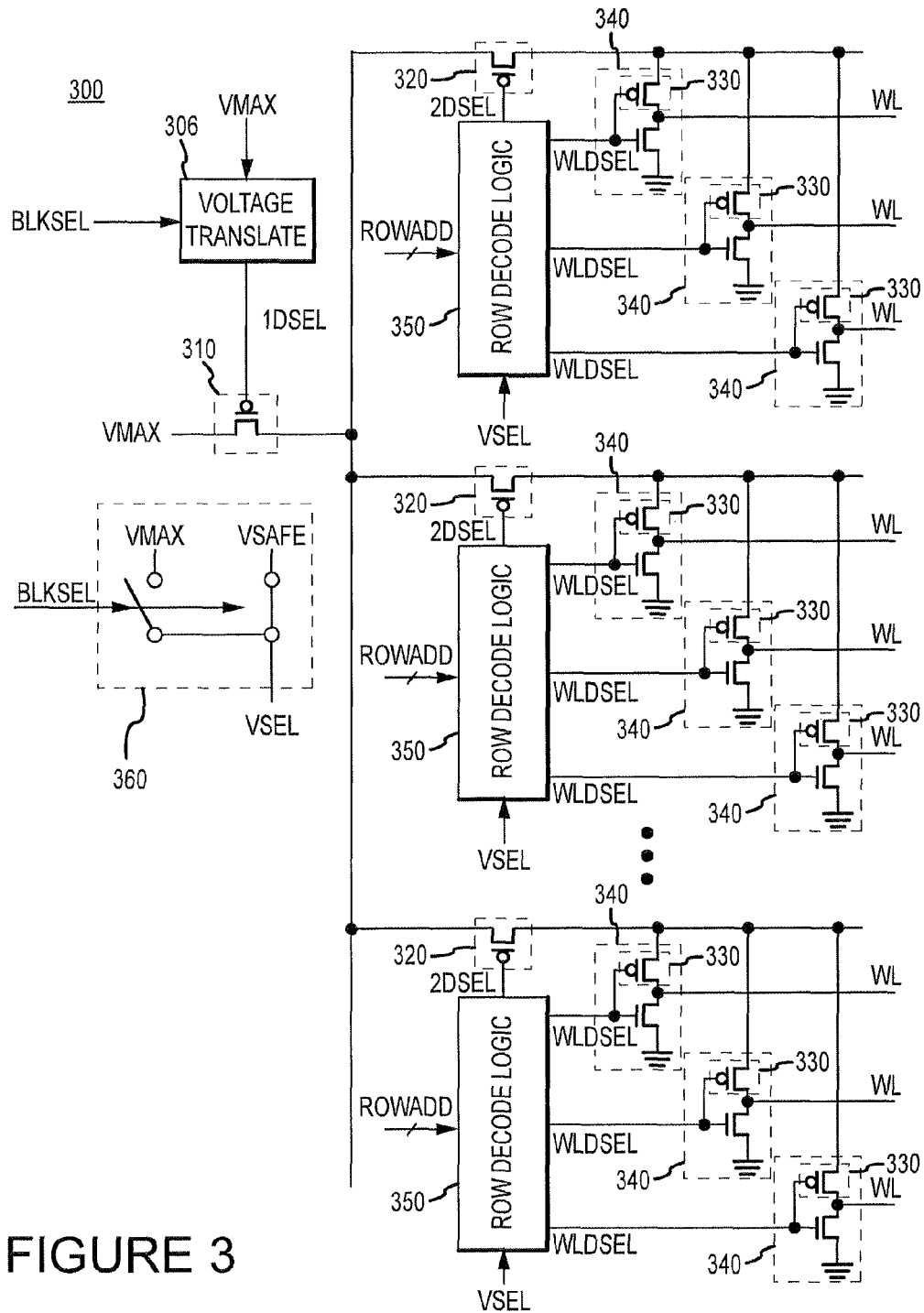
FIG. 3 is a schematic drawing of portions of a block-row decoder according to an embodiment of the invention.

FIG. 3 illustrates a portion of a block-row decoder 300 according to an embodiment of the invention. The portions of the block-row decoder 300 may be included in the block-row decoders 220 of the embodiment of FIG. 2. The block-row decoder 300 includes a first decoder switch 310 and further includes a voltage translator 306 configured to receive the BLKSEL signal and provide a first decoder select signal 1DSEL signal to the first decoder switch 310. As previously described, the BLKSEL signal may be provided by block select logic (e.g., block select logic 210 of FIG. 2). The voltage translator 306 is configured to provide a 1DSEL signal having a voltage of VMAX responsive to an inactive BLKSEL signal. The first decoder switch 310 is configured to selectively provide a voltage provided to its input based on the 1DSEL signal. The first decoder switch 310 may represent a block select switch which when closed (i.e., conductive) provides the voltage at its input to the rest of a tree of decoder switches of the block-row decoder. When the first decoder switch 310 is open (i.e., non-conductive) the rest of the tree of decoder switches is decoupled from receiving the input voltage. An active 1DSEL signal closes the first decoder switch 310 while an inactive 1DSEL signal opens the first decoder switch 310.

The first decoder switch 310 is coupled to second decoder switches 320, which are in turn coupled to a respective group of third decoder switches 330. The third decoder switches 330 may be included in word line drivers 340. The first, second, and third decoder switches may be p-channel field-effect transistors (pFETs) as illustrated for the embodiment of FIG. 3. Other circuits known to those ordinarily skilled in the art may be used for the first, second, and third decoders switches 310, 320, 330 as well. The word line drivers 340 are configured to drive respective word lines WLs to which they are coupled. As illustrated by FIG. 3, the second and third decoder switches 220 and 230 fanout from the first decoder switch 210 to provide a tree of decoder switches. The embodiment of FIG. 3 is illustrated as having an example fanout configuration, however, other fanout configurations may be used as well without departing from the scope of the invention.

Row decode logic 350 is configured to provide word line driver select signals WLDSEL to a respective group of word line drivers 340, and is further configured to provide second decoder switch select signals 2DSEL to respective second decoder switches 220. The WLDSEL and 2DSEL signals may be used to select WLs for memory operations based at least in part on ROWADD addresses provided to the row decode logic 350. For example, in a selected block-row decoder, the first, second and third decoder switches 310, 320, and 330 may be closed to couple a WL to the voltage provided to an input of the first decoder switch 310 (e.g., VMAX) to drive the WL. WLs not selected remain coupled to a reference voltage through respective word line drivers 340 as controlled by respective WLDSEL signals. In the event the block-row decoder 300 is deselected, the first, second, and third decoder switches 310, 320, 330 are controlled by the 1DSEL, 2DSEL and WLDSEL signals to remain open to prevent the voltage provided to the input of the first decoder switch 310 from being provided to the decoder switches.

The block-row decoder 300 further includes a voltage multiplexer 360 configured to provide one of a plurality of voltages as a select voltage VSEL to row decode logic 350. Which one of the plurality of voltages is based at least in part on a state of the BLKSEL signal. In the embodiment of FIG. 3 voltages VSAFE and VMAX may be provided as the VSEL voltage. The VSAFE voltage is less than the VMAX voltage. For example, in some embodiments the VSAFE voltage may be approximately 1-2 volts less than the VMAX voltage. In some embodiments, the VSAFE voltage may be even less than this range.

Operation of the block-row decoder 300 for a deselected condition will be described, that is, operation responsive to an inactive BLKSEL signal. The voltage translator 306 provides a 1DSEL signal having a voltage of VMAX to control the first decoder switch 310 to be open (e.g., non-conductive) responsive to the inactive BLKSEL signal. As a result, the second decoder switches 320 remain decoupled from the voltage provided to the input of the first decoder switch 310. Additionally, the voltage multiplexer 360 is controlled by the inactive BLKSEL signal to provide a VSEL voltage to the row decode logic 350 having the VSAFE voltage. As a result, the row decode logic 360 provides 2DSEL signals having a voltage of VSAFE to control the second decoder switches 320 to remain open (i.e., non-conductive). The row decode logic 360 further provides WLDSEL signals having the VSAFE voltage to control the word line drivers 340 to couple the respective WLs to the reference voltage. Coupling the WLs to the reference voltage causes the WLs to remain deselected.

By providing the second decoder switches 320 and the word line drivers 340 the 2DSEL and WLDSEL having the VSAFE voltage, the second decoder switches 320 and the third decoder switches 330 of the word line drivers 340 are not subjected to the higher voltage of VMAX while the block-row decoder is in a deselected state. As a result, voltage induced stress on the second and third decoder switches may be reduced in comparison to providing 2DSEL and WLDSEL signals having a higher voltage of VMAX. Reducing the stress on the second and third decoder switches 320, 330 for the deselected blocks of memory may improve failure rate, for example, for those memory failures related to transistor breakdown which may be promoted by voltage induced stress.

Figure 4:
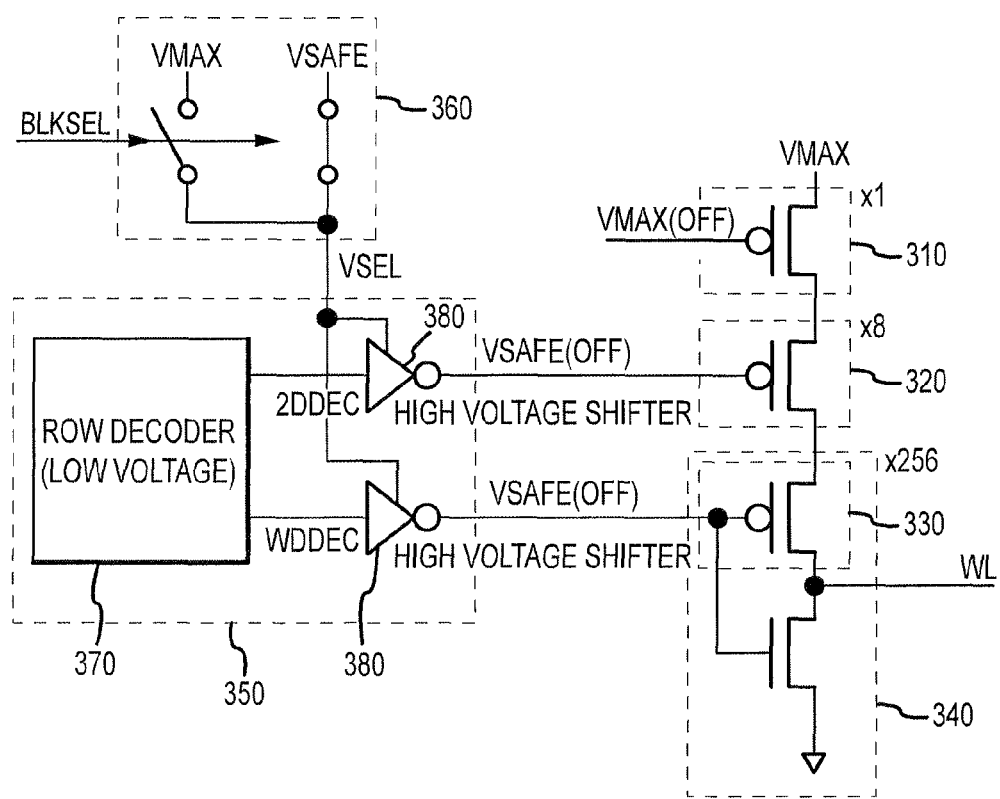
FIG. 4 is a schematic drawing of portions of a block-row decoder during operation according to an embodiment of the invention for a deselected block-row decoder.

FIG. 4 illustrates in simplified form portions of the block-row decoder 300 during operation for a deselected block of memory. An example decoder switch fanout of decoder switches 310, 320, and 330 is illustrated in FIG. 4 by the designation of "x1" for the first decoder switch 310, "x8" for the second decoder switch 320, and "x256" for the third decoder switch 330. That is, in the example fanout of FIG. 4, each block-row decoder includes one first decoder switch 310, which is coupled to eight second decoder switches 320, and each of the second decoder switches is coupled to 256 third decoder switches 330.

As illustrated in the example of FIG. 4, a voltage of VMAX is provided to the first decoder switch 310, and while the block-row decoder 300 is deselected a 1DSEL signal having a voltage of VMAX is provided to control the decoder switch 310 to remain open and thereby cut-off the VMAX voltage from being provided to inputs of any of the second decoder switches 320. Additionally, while the block-row decoder 300 is deselected the voltage multiplexer 360 is controlled to provide a VSEL voltage to the row decode logic 350 having the VSAFE voltage. As previously discussed, the VSAFE voltage is a voltage less than the VMAX voltage.

The VSEL (i.e., VSAFE) voltage is provided to voltage translators 380. The voltage translators 380 may be included in the row decode logic 350. The voltage translators 380 provide 2DSEL and WDSEL signals having the VSAFE voltage responsive to decode signals 2DDEC and WDDEC provided by row decoder 370, which may also be induced in the row decode logic 350. The 2DDEC and WDDEC signals have voltage levels that are relatively low in comparison to the VMAX and VSAFE voltages. The relatively low voltage decode signals are translated into the higher VSAFE voltage 2DSEL and WDSEL signals through the voltage translators 380. The 2DSEL and WDSEL signals control the respective decoder switches to remain open (i.e., non-conductive) to thereby cut-off the VMAX voltage from being provided through the second and third decoder switches 320, 330 to the WLs.

In the previous example a voltage of VSAFE was provided to the second decoder switches 320 and to the third decoder switches 330 while the block-row decoder 300 is deselected. In some embodiments, the voltage provided to the second and third decoder switches 320, 330 are different. For example, a voltage of VSAFE may be provided to only the second decoder switches 320 or to only the third decoder switches 330. In the latter example, the 2DSEL signals provided to the second decoder switches 320 may have the VMAX voltage and the WDSEL signals provided to the third decoder switches 330 may have the VSAFE voltage. In some embodiments, the different voltages that are applied to the second and third decoder switches 320, 330 while the block-row decoder 300 is deselected are both lower than the VMAX voltage. For example, the 2DSEL signals provided to the second decoder switches 320 may have a VSAFE voltage and the WDSEL signals provided to the third decoder switches 330 may have a different voltage. The different voltage provided to the third decoder switches 330 may be less than both the VMAX and VSAFE voltages.

As illustrated in the previous example, embodiments of the invention include applying decoder switch select signals (e.g., 2DSEL and WDSEL) while the block-row decoder is deselected that have voltages which are less than the voltage of the decoder switch select signal (e.g., 1DSEL) that controls whether a voltage provided to the block-row decoder is also provided to switches further down in the decoder switch tree, such as the second and third decoder switches 320, 330.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A block-row decoder, comprising:
a first decoder switch configured to receive a first decoder switch signal having a first voltage responsive to the block-row decoder being deselected to control the first decoder switch to be open;
a plurality of second decoder switches coupled to the first decoder switch, the second decoder switches configured to be open and closed responsive to second decoder switch signals; and
row decode logic coupled to the second decoder switches and configured to decode memory addresses and provide the second decoder switch signals to the plurality of second decoder switches, the row decode logic further configured to provide the second decoder switch signals having a second voltage responsive to the block-row decoder being deselected, the second voltage less than the first voltage.

2. The block-row decoder of claim 1, further comprising:
a plurality of third decoders switches coupled to one of the second decoder switches, the third decoders switches configured to be opened and closed responsive to third decoder switch signals, the row decode logic coupled to the third decoder switches and configured to decode memory addresses and provide the third decoder switch signals to the plurality of third decoder switches, the row decode logic further configured to provide the third decoder switch signals having a third voltage responsive to the block-row decoder being deselected, the third voltage less than the first voltage.

3. The block-row decoder of claim 2 wherein the second and third voltages are substantially equal.

4. The block-row decoder of claim 1 wherein the row decode logic comprises:
a voltage translator configured to provide the second decoder switch signal having the second voltage responsive to a decode signal, the decode signal having a logic level based at least in part on a received memory addresses.

5. The block-row decoder of claim 4 wherein the decode signal has a voltage less than the second voltage.

6. The block-row decoder of claim 1, further comprising:
a voltage multiplexer configured to receive the first and second voltage and further configured to selectively provide the first and second voltage to the row decode logic responsive to a block selection signal, the block selection signal indicative of the block-row decoder being deselected or selected.

7. The block-row decoder of claim 1 wherein the first decoder switch is configured to receive an input voltage substantially equal to the first voltage while the block-row decoder is deselected.

8. A memory block-row decoder, comprising:
a plurality of block-row decoders, each of the block-row decoders having a decoder switch tree and each block-row decoder configured to bias a block select switch of the decoder switch tree with a first voltage while the block-row decoder is deselected and further configured to bias decoders switches of the decoder switch tree that are coupled to the block select switch with a second voltage while the block-row decoder is deselected, wherein the second voltage less than the first voltage and the second voltage is within a range of 1 to 2 volts less than the first voltage.

9. The memory block-row decoder of claim 8 wherein each of the decoder switches of the decoder switch tree comprise pFETs.

10. The memory block-row decoder of claim 8 wherein the block select switch of each of the block-row decoders comprises a pFET.

11. The memory block-row decoder of claim 8 wherein each of the block-row decoders further include a plurality of word line drivers coupled to the decoder switches.

12. The memory block-row decoder of claim 11 wherein a word line driver comprises a pFET coupled to a respective decoder switch and an nFET coupled to the pFET, the pFET and nFET of the word line driver coupled to be provided the second voltage while the block-row decoder is deselected.

13. A memory, comprising:
an array of memory arranged in blocks of memory; and
a memory block-row decoder coupled to the blocks of memory, the memory block-row decoder comprising:
a plurality of block-row decoders, each block-row decoder coupled to word lines of a respective one of the blocks of memory, each block-row decoder having a decoder switch tree and configured to bias a block select switch of the decoder switch tree with a first voltage while the block-row decoder is deselected and further configured to bias decoders switches of the decoder switch tree that are coupled to the block select switch with a second voltage while the block-row decoder is deselected, wherein the second voltage less than the first voltage and the second voltage is within a range of 1 to 2 volts less than the first voltage.

14. A method of deselecting a decoder of a memory, the method comprising:
providing a first voltage while the decoder is deselected to a first decoder switch, the first decoder switch configured to be a first level of a decoder switch tree and further configured to provide an input voltage to all other levels of the decoder switch tree;
providing a second voltage while the decoder is deselected to a plurality of second decoder switches coupled to the first decoder switch, the second decoder switches configured to be a second level of the decoder switch tree, the second voltage less than the first voltage; and
providing a third voltage while the decoder is deselected to a plurality third decoder switches coupled to one of the second decoder switches, the third decoder switches configured to be a third level of the decoder switch tree and each of the third decoder switches coupled to a respective word line.

15. The method of claim 14 wherein the third voltage is substantially equal to the second voltage.

16. The method of claim 14, further comprising providing the third voltage while the decoder is deselected to a plurality of transistors coupled to a reference voltage, each of the plurality of transistors coupled to a respective word line.

17. A method of selecting a block of memory from a plurality of blocks of memory, the method comprising:
providing a first voltage to the plurality of block-row decoders, each block-row decoder coupled to a respective one of the plurality of blocks of memory;
controlling a block select switch of a block-row decoder coupled to a selected one of the plurality of blocks of memory to be conductive;
providing the first voltage to block select switches of the block-row decoders coupled to deselected ones of the plurality of blocks of memory to control the block select switches to be non-conductive; and
providing a second voltage to decoder switches of the block-row decoders coupled to the deselected ones of the plurality of blocks of memory including translating a third voltage to the second voltage responsive to an inactive decode signal, the decoder switches coupled to the block select switch of a respective block-row decoder, wherein the second voltage is less than the first voltage and the third voltage less than the second voltage.

18. The method of claim 17 wherein the second voltage is substantially in a range of 1 to 2 volts less than the first voltage.

19. The method of claim 17, further comprising driving word lines of the selected block of memory with the first voltage.

* * * * *

UNITED STATES PATENT AND TRADEMARK OFFICE
CERTIFICATE OF CORRECTION

PATENT NO.         : 8,625,382 B2
APPLICATION NO.    : 13/168699
DATED              : January 7, 2014
INVENTOR(S)        : Nicholas Hendrickson Page 1 of 1

It is certified that error appears in the above-identified patent and that said Letters Patent is hereby corrected as shown below:

On the Title page, in item (75), in "Inventor", in column 1, line 1, delete "Ranch Cordova," and insert -- Rancho Cordova, --, therefor.

In the Claims:
In column 7, line 36, in Claim 14, after "plurality" insert -- of --.

Signed and Sealed this
Fifteenth Day of April, 2014

Michelle K. Lee
*Deputy Director of the United States Patent and Trademark Office*